United States Patent [19]

Elkins et al.

[11] 4,088,896
[45] May 9, 1978

[54] ACTINIC RADIATION EMISSIVE PATTERN DEFINING MASKS FOR FINE LINE LITHOGRAPHY AND LITHOGRAPHY UTILIZING SUCH MASKS

[75] Inventors: Perry E. Elkins, Santa Ana; A. Brooke Jones, La Mirada; John P. Reekstin, Jr., Orange, all of Calif.

[73] Assignee: Rockwell International Corporation, El Segundo, Calif.

[21] Appl. No.: 752,638

[22] Filed: Dec. 20, 1976

[51] Int. Cl.² .............................................. G21K 5/04
[52] U.S. Cl. ................................. 250/505; 250/492 A
[58] Field of Search ........................... 250/492 A, 505

[56] References Cited

U.S. PATENT DOCUMENTS 3,843,916 10/1974 Trotel et al. ................. 250/492 A X
4,008,402 2/1977 O'Keeffe et al. ................. 250/492 A Primary Examiner—Archie R. Borchelt
Attorney, Agent, or Firm—H. Fredrick Hamann; G. Donald Weber, Jr.; Robert Ochis

[57] ABSTRACT

An actinic radiation emissive mask for a high resolution lithography emits actinic radiation which originates within the mask. The mask patterns the actinic radiation to expose resist in accordance with a desired pattern. The actinic radiation originating in the mask may be produced by radioactivity, stimulated emission or combinations thereof.

10 Claims, 6 Drawing Figures

U.S.Patent    May 9, 1978    4,088,896

ACTINIC RADIATION EMISSIVE PATTERN DEFINING MASKS FOR FINE LINE LITHOGRAPHY AND LITHOGRAPHY UTILIZING SUCH MASKS

BACKGROUND OF THE INVENTION

1. Field of the Invention

The invention relates to the field of lithography for microelectronics and more particularly to high resolution lithography for use in forming dense, small, accurately dimensioned features.

2. Prior Art

Microelectronic lithography utilizing photoresists which are sensitive to visible or ultraviolet light have been in use for a number of years. These photoresists and associated exposure techniques have been a mainstay of the microelectronic arts and have been utilized for the production of countless microelectronic devices. However, as the state of the art in microelectronics has progressed, devices requiring smaller and smaller dimensions have been developed. These increasingly smaller devices have required constantly improving lithographic resolution in order to achieve satisfactory pattern definition and device yields. With currently available visible and ultraviolet light dependent exposure techniques, the minimum linear dimension of a feature of a microelectronic structure which can be accurately replicated is about 1 micron. Greater accuracy is not obtainable utilizing visible and ultraviolet actinic radiation because this actinic radiation has a sufficiently long wavelength that diffraction limits the achievable accuracy and resolution.

The adverse effects produced by diffraction can be minimized by utilization of conformable contact masks with visible and ultraviolet exposing radiation. However, contact of the mask with a microelectronic structure during manufacturing tends to introduce defects in the finished device by abrasion and contamination. Further, the resolution utilizing this technique is limited by the presence of dust particles which themselves act as individual masks and produce local separations between the mask and the substrate thereby degrading resolution.

In order to improve lithographic resolution over that obtained with ultraviolet and visible light systems, exposure techniques utilizing electron beams have been developed. Such systems provide excellent resolution but are not efficient large scale production techniques because of the high cost of exposure equipment and because present system require that the electron beam essentially draw the desired exposure pattern on the resist layer. The time required for the exposure of a pattern on an individual resist coating could be substantially reduced if electron projection lithography could be utilized. However, to date election projection lithgraphy has not been successful, inter alia, because of distortion problems.

In another attempt to improve on visible and ultraviolet light systems, X-ray lithography has been developed. This technique provides for exposure of entire wafers simultaneously. Unfortunately, special equipment is required because of the difficulty of generating well collimated X-rays of high intensity, and this complicates the overall system. Further, improved alignment techniques are needed in order to take full advantage of the benefits which may be provided by X-ray exposure.

Also as discussed in detail in an article entitled "Replication of $0.1\mu$ Geometries with X-ray Lithography" by Feder et al., Journal of Vacuum Science Technology, Vol. 12, No. 6, November/December 1975, pages 1332-1335, secondary electron generation upon absorption of X-rays inherently limits the resolution obtainable with X-ray lithography. The degree to which secondary electron emission limits the resolution of X-ray lithography depends on the range of the secondary electrons in the photoresist. To minimize the resolution problems of X-ray lithography, Feder et al recommend the use of carbon $K\alpha$ low energy X-rays which generate secondary electrons having a minimum range in the resist.

SUMMARY OF THE INVENTION

The problems of prior art lithographic systems are overcome by the present invention through use of actinic radiation emissive masks for the exposure of pattern defining resists. In a projection lithography embodiment the present invention avoids diffraction problems through utilization of actinic radiation having effective wavelengths much smaller than 1 ym. In a contact transfer embodiment of the invention, the need for projection exposure of the resist can be eliminated.

DESCRIPTION OF THE PREFERRED EMBODIMENTS

Figure 1:
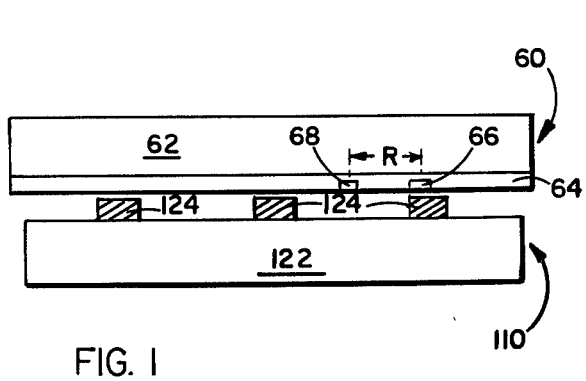
FIG. 1 through 6 are each cross-sectional illustrations of various embodiments of radiation emissive for radiation sensitive resist exposure masks in accordance with the invention.

There are numerous embodiments of actinic radiation emissive masks in accordance with the present invention. These embodiments can be grouped for discussion purposes in accordance with the manner in which the actinic radiation is patterned and in accordance with the manner in which the actinic radiation originates.

In order to simplify the explanations of the various mask configurations, the following terminology will be utilized. A patterned layer in its most general sense is one comprised of at least two different types of areas which have differing characteristics. For simplicity in discussing the patterning of the mask, the patterned areas will be discussed in terms of "exposing areas" and "non-exposing areas. " An "exposing area" is defined as an area of the mask which is intended to expose that portion of a photoresist layer which is in alignment therewith and a "non-exposing area" is defined as an area of the mask which is intended to prevent exposure of that portion of a resist layer which is in alignment therewith. Actinic radiation emissive material is defined as material within which the emitted actinic radiation originates, as opposed to a material which merely absorbs and/or transmits the radiation.

For clarity of discussion and reference, masks in accordance with the invention will be classified as class I or class II masks in accordance with the manner in which patterning is achieved. A mask is classified as a class I mask where patterning of the mask is achieved substantially entirely by patterning the radiation emissive material so that the radiation emissive material is present only in exposing areas of the mask. Class I masks depend on the inherent variation of radiation intensity with distance from the source which is characteristic of an uncollimated source of radiation in order to produce a patterned exposure of a resist layer.

A mask is classified as a Class II mask where patterning of the mask is achieved by providing a patterned actinic radiation absorbing material between the radiation emissive material and the resist layer. The absorbing material is patterned to allow exposing quantities of actinic radiation to pass through exposing portions of the absorber and to prevent exposing quantities of the actinic radiation from passing through the non-exposing areas of the absorbing material. In a Class II embodiment, the actinic radiation emissive material may be disposed on a mask substrate either in a uniform manner both in exposing and non-exposing areas of the mask or in a patterned manner in which the emissive material is present only in the exposing areas of the mask. In either event, an actinic radiation absorber is disposed in the non-exposing areas of the mask to absorb enough actinic radiation within the non-exposing areas of the mask to render them non-exposing. Thus, the radiation absorber of this class of embodiments is patterned either as to thickness or absorption coefficient so that all but a non-exposing quantity of the emitted radiation is absorbed in the non-exposing portions of the mask, but exposing quantities of the emitted radiation pass through the exposing portions of the absorber layer to expose a resist layer brought into alignment therewith.

The actinic radiation emitting material of the mask will be classified as type I or type II in accordance with the manner in which the actinic radiation originates. An actinic radiation emitting material which spontaneously emits radiation will be classified as a type I emitting material. An actinic radiation emitting material which must be externally stimulated in order to generate exposing quantities of the emitted actinic radiation will be classified as a type II emitting material. The external stimulation required to stimulate a type II material depends on the particular type II material. The stimulation may be by radiation having characteristics which differ from those of the emitted actinic radiation, or the stimulation may be supplied in the form of electric current, electric voltage, an electromagnetic field, a chemical reaction, heat or other appropriate forms.

A class I mask in accordance with the invention is illustrated generally at 110 in FIG. 1. Mask 110 comprises a substrate 122 which is dimensionally stable under the conditions of use and has a patterned layer of actinic radiation emissive material 124 disposed thereon. Radiation emissive material 124 is patterned to be present in exposing areas of the mask and absent in non-exposing areas of the mask. If desired, a thin protective actinic radiation transmissive film may be disposed over emissive material 124 in order to prevent material 124 from being rubbed off of or smeared along the surface of substrate 122. Mask 110 is illustrated in alignment with a wafer shown generally at 60 which is to be exposed. Wafer 60 comprises a wafer substrate 62 having a radiation-sensitive resist layer 64 disposed on a substrate surface which is to be patterned. To expose resist layer 64, the actinic radiation emissive material 124 of mask 110 is disposed in contact with or closely adjacent to the resist layer 64. Radiation emissive material 124 is preferably one which emits actinic radiation having a range in the resist which is substantially equal to the thickness of the resist layer. This will maximize the resolution obtained in exposing the resist. The quantity of radiation which impinges on the resist per unit area of the resist varies with the distance of the unit area of resist from the source of the radiation. The quantity of radiation per unit area has its greatest rate of variation as a function of distance from the source in the vicinity of the source. Therefore, it is preferable to use mask 110 of FIG. 1 for contact exposure of or spaced from the resist by a distance which is small compared with the width of non-exposing areas of the mask. In this way the variation of intensity with distance can be utilized to produce selective exposure of the resist in the immediate vicinity of the radiation emissive material in preference to the exposure of the resist which is spaced further from the emissive material. As is illustrated in FIG. 1, unit area 66 of resist 64 which is closest to the emissive material 124 will experience a substantially greater radiation dose per unit time than will the unit area 68 which is displaced from the emissive material by a distance R. Region 66 will be exposed to a radiation which is larger by a factor which is a function of $R^2$ than that dose to which the region 68 will be exposed. Consequently, with proper control of the exposure time, the portion of resist 64 which is in the immediate vicinity of the emissive material 124 may be fully exposed to its full depth while portions of the resist which are further from the emissive material 124 are left substantially unexposed. At the resist surface adjacent the mask an area of the resist which is exposed by the mask will have a width which is typically at least the width of the exposing emissive material segment plus twice the depth of the resist. The demarcation line between exposed and unexposed resist depends also on the characteristics of the developer utilized and the development time, as is well known in the art. At the interface between the photoresist 64 and the surface of substrate 62 an area of the resist which is exposed by the mask will typically have a width which is less than the width of the exposed area at the surface of the photoresist adjacent the mask.

Class II masks in accordance with the invention increase the density of the pattern features which may be accurately reproduced the density features which can be accurately reproduced by class I masks. A first basic class II mask is illustrated generally at 210 in FIG. 2. Class II mask 210 comprises a substrate 222 similar to substrate 122 of class I mask 110 and patterned deposits 224 of actinic radiation emissive material similar to the patterned deposits 124 of mask 110. In addition, mask 210 includes a patterned actinic radiation absorbing material 246 which absorbs actinic radiation which enters material 246, thereby rendering mask 210 a class II mask in accordance with the definition given previously. Openings 247 in the patterned absorbing material 246 are aligned with the patterned deposits 224 of actinic radiation emissive material and comprise exposing areas of mask 210. In the specific embodiment illustrated in FIG. 2, where the openings 247 in absorbing material 246 are the same width as and aligned with the deposits of radiation emissive material 224, the exposing areas of the mask are restricted to having substantially the same width as the corresponding portions of emissive material 224. The areas where absorbing material 246 is present comprise non-exposing areas of mask 210. By absorption of unwanted radiation, the radiation absorbing material 246 collimates the emitted radiation to restrict exposing intensities of the emitted radiation to the exposing areas 247 of the mask. The manner in which absorber 246 collimates the emitted radiation is illustrated by representative sets of rays 252, 254, 256 and 258. Rays 252 reach resist 64 without encountering absorber 246. Consequently, they interact with the resist layer 64 in an exposing manner. Rays 254 pass through a small portion of the absorbing material 246 with the result that the probability of their being absorbed by the absorbing material 246 is small. Consequently, they may interact with the resist layer 64 in an exposing manner. If the nature of the emitted radiation is such that passing through absorber 246 in the manner of rays 254 reduces the energy or intensity of the emitted radiation, then some of the rays 254 will be able to interact only with the surface portion of resist layer 64. Rays 256 are emitted in directions away from resist layer 64 with the result that they are incapable of experiencing exposing interactions with the resist 64. Rays 258 are emitted in directions which would result in their encountering the resist layer 64 in the absence of absorber 246. However, they are emitted in directions which carry them through substantial thicknesses of absorber 246. As a result, there is a very small probability of any of these emitted rays passing through all of the absorber between their point of emission and the resist layer to experience an exposing interaction with the resist. As a result of the absorption of rays which pass through a significant portion of the absorbers 246, the intensity of the emitted radiation reaching the resist is much greater within the exposing openings 247 than it is in the non-exposing areas. Consequently, by proper control of the period of time for which the resist is exposed to the actinic radiation, exposure of the resist can be limited so that only those areas which are in alignment with exposing areas of the mask will develop as exposed areas when the resist layer is developed in an appropriately controlled manner.

The collimated nature of the radiation emitted by a class II mask improves the resolution obtained with a class II mask over that obtained with a class I mask so long as the separation S between mask 210 and wafer 60 is small compared to the distance D by which the upper surface of radiation emissive material 224 is set below the upper surface of absorbing material 246, provided the wavelength λ of the actinic radiation is much less than the dimensions of the non-exposing areas in order that the laws of geometric optics prevail. The greatest resolution will be obtained where $D >> S$. The limit for this condition is having the upper surface of absorber 246 in contact with resist layer 64 of wafer 60. However, since such contact can create significant problems of photoresist and/or absorber scratching, a slight separation between mask 210 and wafer 60 is preferred.

The improved resolution obtained with a class II mask over that obtained with a class I mask is achieved at the expense of the use of a radiation emissive material which emits a greater quantity of actinic radiation or the use of increased exposure times. For a given intensity of radiation emission by the radiation emissive material $x24$ ($x = 1$ for the class I mask 110 of FIG. 1 and $x = 2$ for the class II mask 210 of FIG. 2) the improved resolution obtained with a class II mask as compared to a class I mask necessitates an increase in the exposure time required to properly expose a given resist layer. This is because of the variation in radiation dose per unit area per unit time with distance from the source. This variation was discussed in connection with the resolution obtained with the class I mask of FIG. 1. This variation also directly affects the exposure time required with a class II mask even though the class II mask emits collimated radiation because the collimation of the radiation is obtained not through focusing of emitted radiation but rather through the absorption of emitted radiation which is not within the desired column. For a given intensity of emitted radiation, the exposure time required with a class II mask can be minimized by utilizing an absorber 246 which has a high absorption coefficient and making absorber 246 only as thick as is necessary to prevent exposure of the resist in the non-exposing regions of the mask and by making the distance S small enough that the ratio D/S for the resulting mask wafer alignment during exposure is sufficient to provide the desired resolution in the reproduction of the mask pattern. Since the exposure time required is inversely proportional to the intensity of the emitted radiation, the exposure time required with either a class I or a class II mask can be decreased by increasing the intensity of radiation emission by material 124 or 224, provided this increase is obtained without changing the energy distribution of the emitted radiation, since such a change would effect the range of the emitted radiation and thus its ability to expose the resist and its ability to expose the resist and its ability to penetrate an absorbing layer. Both class I and class II masks may be utilized in mask exposure fixtures which include a shutter to prevent exposure of the resist during mask alignment.

Figure 3:
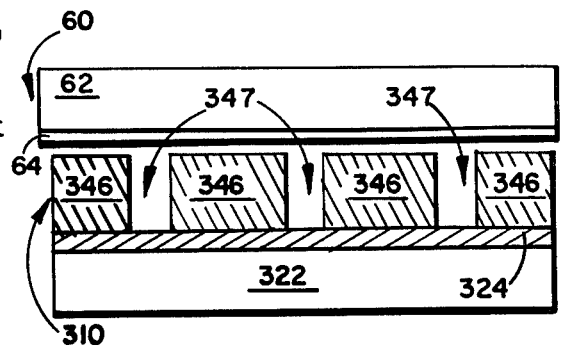

A second basic class II mask is illustrated generally at 310 in FIG. 3. The mask 310 is substantially identical to the mask 210, with the exception that the radiation emissive material 324 of mask 310 forms a continuous layer rather than being patterned as is the radiation emissive material 224 of mask 210. Consequently, the construction of mask 310 is not discussed in detail inasmuch as the relationship between the corresponding portions of the mask will be readily apparent. The exposure produced by the mask 310 will be substantially identical to that used by the mask 210. The basic difference between the two masks is that the mask 210 requires patterning of the radiation emissive material 224 and the absorbing material 246 whereas the mask 310 requires patterning only of the radiation absorbing material 346.

It will be understood that both masks 210 and 310 may be used either for contact exposure or for projection exposure where the mask is separated from the photoresist layer 64 by a small distance S where $S << D$.

Figure 4:
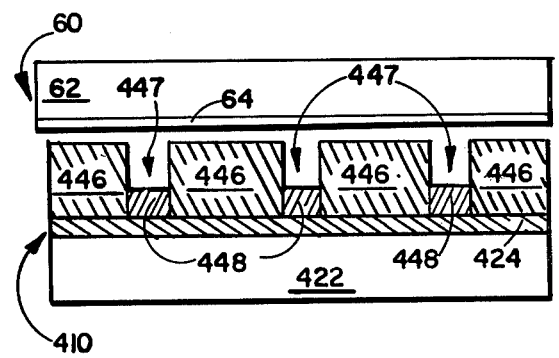

A modified class II mask is illustrated generally at 410 in FIG. 4. Mask 410 is similar to mask 310 of FIG. 3 and includes components which correspond to each component of mask 310. The components of mask 410 have been given reference numerals in the 400s which correspond to the reference numerals in the 300s which designate the corresponding elements of mask 310. In addition to the elements which correspond to elements of mask 310, mask 410 incorporates a patterned radiation retarding material 448 which is disposed within the openings 447 of patterned absorbing material 446. This mask configuration is useful where the actinic radiation emissive material emits actinic radiation having a higher energy of the emitted radiation can be reduced to a more optimum value by passing it through the radiation retarding material 448 which absorbs a portion of the energy of the actinic radiation. Where the retarding material 448 and its thickness is selected in a manner which results in the actinic radiation in the exposing areas of the mask exposing the full depth of the resist, but with insignificant quantities of the actinic radiation entering the substrate 62, the presence of the absorber maximizes the resolution of the mask inasmuch as any radiation which enters the absorber 446 after passing through the retarder 488 can be expected to have insufficient energy to expose the full depth of the resist. Consequently, upon properly controlled development of the resist only those portions which were in alignment with the exposing portions of the mask will be developed to their full depth as having been exposed. The thickness of the retarding material 448 which is appropriate must be determined from the optimum actinic radiation energy for exposure of the resist layer 64, the energy of the actinic radiation emitted by radiation emissive material 424 and the rate at which the retarding material 448 retards the emitted radiation. The selection of the particular radiation retarding material which is utilized for retarders 448 will depend on the nature of the radiation emitted by radiation emissive material 424, the degree of retardation desired and the thickness of the retarding material which is permissible in view of the mask dimensions. Where appropriate, retarding material 448 may be the same material as is utilized for absorbers 446 with the result that the absorbers 446 together with the retarders 448 form a substantially continuous coating of a single material the depth of which varies in accordance with whether that portion of the coating is within an exposing area of the mask or a non-exposing area of the mask.

Figure 2:
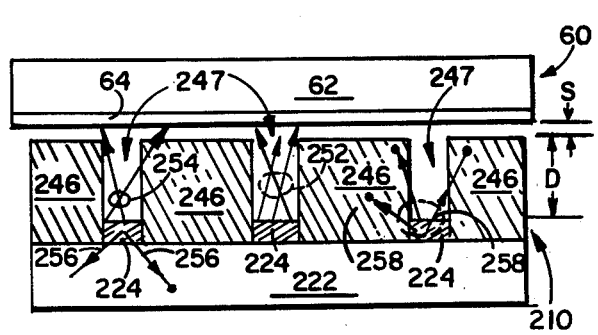

The use of retarding material is also appropriate in masks of the configuration of mask 210 of FIG. 2, when the energy of the emitted radiation makes a reduction in its energy desirable. Mask 410, like masks 210 and 310 may be utilized either for contact exposure of the resist layer 64 or for proximity exposure of the mask where the mask is spaced slightly from the resist in order to prevent detrimental effects which might result from contact between resist layers 64 and absorber 446. Although not preferred, it is also possible to utilize the mask as a projection mask where the separation S between the mask and the resist layer is large. Such use is not preferred because of the substantial thickness of absorbers 446 required to yield good collimation of the emitted radiation when S is large.

Figure 5:
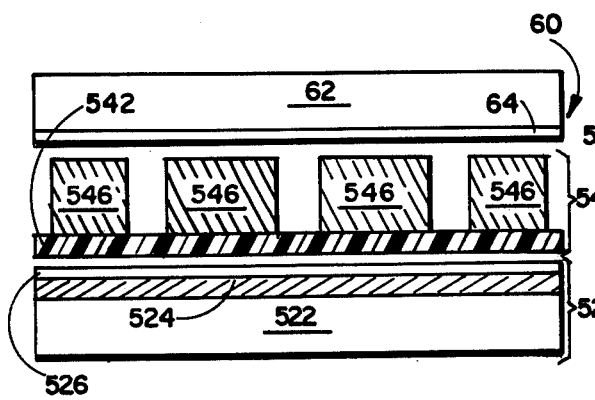

A further modification of class II masks in accordance with the invention is illustrated generally at 510 in FIG. 5. Mask 510 is divided into two separate portions: an actinic radiation emissive structure 520 and a patterned actinic radiation absorbing structure 540. Emissive portion 520 comprises a substrate 522 and a uniform actinic radiation emissive layer 524 which are similar to the substrate and emissive layer, respectively, of other class II masks. In addition, emissive portion 520 may also include an optional protective layer 526 over emissive layer 524. The protective layer 526 should be substantially transmissive of the actinic radiation emitted by layer 524 and is intended to provide mechanical and/or environmental protection for the layer 524. Consequently, the layer 526 need not be included when such protection is not necessary. The patterned actinic radiation absorbing structure 540 of the mask comprises a patterned absorbing material 546 which is similar to the absorbing layers of the other class II masks and which is patterned in accordance with the pattern which it is desired to expose the photoresist layer 64. Structure 540 also must include a substrate portion 542 which is dimensionally stable in use if absorbing material 546 is not self supporting. Substrate 542 must be sufficiently transmissive of the actinic radiation emitted by layer 524 that exposing doses of the radiation are available in the exposing portions of the absorbing structure 540. Absorbing structure 540 is removable from and reuseable with emitting structure 520. Other absorbing structures having differing patterning may also be utilized with emitting structure 520, thereby making 510 an alterable mask. In this way the number of emitting structures 520 which must be available in a production line may be substantially reduced from the number which would otherwise be required. The alterable mask 510 is most useful for use with patterning structures 540 which are infrequently utilized or are utilized for small production runs which do not justify the expense of a dedicated emissive layer. The masks 510 will also be useful in those situations where the separation S between the mask and the photoresist layer needs to be small enough that it is impractical to utilize a shutter to control exposure time and the exposure time is short enough that alignment of the absorbing structure 540 with the wafer 60 must be accomplished in the absence of exposing actinic radiation and the emissive layer 524 is a type I material which spontaneously emits actinic radiation. In these circumstances, the absorbing structure 540 may be aligned with the wafer 60 while the emitting structure 520 is not present and the emitting structure 520 placed on absorbing structure 540 after alignment is achieved. If emissive layer 524 is a type II emissive material which only emits actinic radiation upon external stimulation then emitting structure 520 and the absorbing structure 540 may be combined prior to aligning the mask 510 with the wafer 60 even where short exposure times are utilized because the external stimulation which is required to cause the type II material to emit actinic radiation can be withheld until proper alignment is achieved.

Resists for use with this invention may be selected from electron sensitive and photon sensitive resists in accordance with the selected actinic radiation and may include polymethyl methacrylate, poly (butane - 1 sulfone), epoxidized polybutadiene, poly glycidyl methacrylate-ethyl acrylate, poly methacrylamide, vinyl ether-maleic anhydride copolymer and so on.

The actinic radiation transmissive materials are composed on thin films or layers of low atomic number elements, while materials composed of high atomic number elements are actinic radiation absorbers and retarders.

Type I emitting materials which spontaneously emit the actinic radiation will generally be radioactive. In order to simplify the presentation thereof, representative types of radiation which may be provided by type I emissive material are presented along with representative source materials in Table 1.

TABLE 1

| Actinic Radiation | representative source materials |
|---|---|
| β | $H^3$, $Kr^{85}$, $Pr^{147}$, $Ru^{106}$, $Ni^{63}$, $Re^{187}$ $Am^{241}$ |
| α | $Ho^{153}$, $Er^{154}$, $Po^{208}$, $Po^{209}$, $Po^{210}$ |
| γ | $I^{129}$, $Hg^{197}$ |
| Photons by Electron Capture | $Ho^{163}$, $Cd^{109}$, $Ni^{59}$, $Fe^{55}$, $Rh^{102}$ |
| Electrons and by Isomeric Transition | $Ta^{181}$, $Rh^{103}$, $Nb^{93}$ |

Type II emitting materials which require external stimulation may be stimulated in a number of different ways in accordance with the characteristics of the emitting material. A number of representative type II source materials are presented in Table 2 along with the type of radiation emitted thereby and the form in which stimulation is provided.

TABLE 2

| Actinic Radiation | Emitting Material | Stimulated by |
|---|---|---|
| Secondary Electrons | Heavy Metals | X-Rays |
| X-rays | β-emitter | β-rays |
| X-rays | Elemental Target | Electron Bombardment |
| Photons | Light Emitting Diode | Electric Current |
| UV-soft X-rays | Plasma | Laser |

Neither Table 1 nor Table 2 is intended to be limiting as to the emitting materials which may be utilized in the mask in accordance with this invention, but rather are intended to be illustrative of some basic type I and type II emissive materials. It will be noted that radiation stimulated type II materials may be ones which emit the actinic radiation as an inherent by-product of absorption of the incident radiation or may be ones in which the incident radiation is absorbed and subsequently re-emitted as actinic radiation in a manner similar to that utilized in optically pumped lasers. Other emitting layers may themselves be microelectronic devices which are stimulated by externally supplied voltage or current as in the use of a light emitting diode or solid state lasing structure.

Radiation conversion masks in accordance with the invention overcome the inherent resolution problem of x-ray lithography by intentionally generating long range secondary electrons having a penetration range sufficient to expose the entire depth of the photoresist layer and by positioning the patterning layer of the mask to selectively absorb the secondary electrons emitted by the radiation conversion material rather than positioning the patterning layer of the mask to absorb the incident X-rays as is done in the prior art. In this way, an incident X-ray flood is converted to individual collimated beams of secondary electrons which are restricted to those areas where it is desired to expose the photoresist. Thus, radiation conversion masks in accordance with the invention achieve the results toward which flooding-type electron lithography has been striving, while avoiding projection electron lithography's distortion and problems of obtaining uniform exposure of the resist material beneath the transmissive portions of the mask while simultaneously achieving total absorption of the electrons in the non-transmissive portions of the mask. It will be noted that where X-rays are utilized to generate actinic secondary electrons, relatively hard or high energy X-rays which generate secondary electrons having a range greater than or equal to the depth of the resist, may be utilized to obtain high resolution exposure, contrary to the teachings of the prior art.

When the radiation conversion material and the secondary electron-absorbing material are both conductive, the mask may be connected to a predetermined potential such as ground voltage in order to prevent the emission of secondary electrons from causing the mask to accumulate a charge which could have detrimental effects on the mask and/or the device on which the resist layer is disposed.

Figure 6:
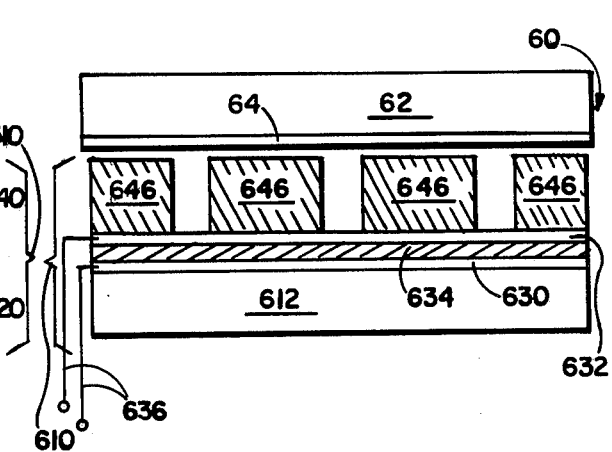

A further embodiment of a class II mask incorporating a type II electrically stimulated emissive material is illustrated generally at 610 in FIG. 6. Mask 610 comprises a substrate 612, a conductive layer 630 disposed thereon, electrically excitable radiation emissive layer 634 disposed on layer 630, a second conductive layer 632 disposed on layer 634 and a radiation absorbing layer 646 disposed on layer 632. Emissive layer 634 may comprise a solid state laser or light emitting diode which emits actinic radiation capable of exposing the photoresist layer 64 of wafer 60. The details of the internal construction of layer 634 and the nature and configuration of conductive layers 630 and 632 will depend on the particular implementation utilized to convert input electric power to emitted radiation. However, any material (including layer 632) which is disposed between the emissive material 634 and the resist 64 in exposing areas of the mask must be sufficiently transmissive of the emitted actinic radiation to allow exposing intensities of the actinic radiation to reach the resist. It will be understood that the ultimate resolution producible with mask 610 will depend on the wavelength of the emitted radiation and the separation between resist layer 64 and mask 610 since these characteristics control the extent to which diffraction will limit the resolution obtainable.

EXAMPLE

A layer of poly glycidyl methacrylate-co-ethyl acrylate resist material was disposed on a test substrate via well known spinning techniques. The resulting resist layer was prebaked in accordance with accepted procedures. A self-supporting patterned metallic absorbing structure was disposed on the resist layer. A radiation emissive structure including 100 microcurie $A_m^{241}$ source of radiation was placed on the absorbing structure for a period of 1000 hours. Following normal development of the resist, an overexposed resist pattern remained on the substrate, the pattern was a negative of the absorbing structure as was expected.

A new class of masks for patterned exposure of resists for microelectronics has been illustrated and described. Those skilled in the art will be able to vary the details of the illustrative preferred embodiments, however, since these embodiments are illustrative, rather than limitive, the protection afforded this invention is defined by the appended claims.

What is claimed is:

1. A mask for exposing radiation sensitive resist in a non-uniform, patterned manner comprising:
   substrate means;
   actinic radiation emissive means supported by said substrate means for emitting actinic radiation; and
   patterning means disposed between said actinic radiation emissive means and the location in which a resist layer to be exposed would be located for restricting the emitted actinic radiation to exposing resist in a non-uniform manner determined by the pattern of said patterning means.

2. The mask recited in claim 1 where said actinic radiation emissive means comprises actinic radiation emissive material disposed on said substrate means in a pattern corresponding to the desired resist exposure pattern.

3. The mask recited in claim 1 wherein:
   said actinic radiation emissive means is disposed on said substrate means at least in those areas where exposure is desired; and
   said patterning means comprises actinic radiation absorbing means disposed to absorb actinic radiation which would expose portions of a resist layer which it is desired to leave unexposed.

4. The mask recited in claim 3 wherein said actinic radiation absorbing means is patterned to be less absorbing in areas where exposure is desired than it is in areas where non-exposure is desired.

5. The mask recited in claim 4 wherein said radiation absorbing means is thinner in areas where exposure is desired than in areas where non-exposure is desired.

6. The mask recited in claim 1 wherein said actinic radiation emissive means comprises a material which spontaneously emits actinic radiation without external stimulation.

7. The mask recited in claim 1 wherein said actinic radiation emissive means comprises radiation emissive means which emit actinic radiation only in response to external stimulation.

8. A method of exposing a resist layer in a patterned manner comprising:
 disposing in proximity to and in proper alignment with said layer a patterned mask which emits patterned actinic radiation in a self-limited exposing pattern without need for externally supplied focusing fields; and
 removing said mask after a period of time which provides proper exposure of said resist in the pattern of said mask.

9. The method recited in claim 8 wherein said mask only emits actinic radiation in response to external stimulation and said method further comprises externally stimulating said mask while it is in proper alignment with said layer and for a time which provides proper exposure of the resist.

10. A mask for exposing radiation sensitive resist in a non-uniform, patterned manner comprising:
 substrate means;
 patterned actinic radiation emissive means supported by said substrate means for exposing resist in the pattern of said actinic radiation emissive means;
 said mask adapted to be placed in sufficiently close proximity to the resist to be exposed that chemically distinguishable degrees of exposure result from the $1/R^2$ dependency of the actinic radiation intensity, wherein R is the distance from the emissive material to the resist material.

* * * * *